(12) United States Patent
Sheu et al.

(10) Patent No.: US 8,605,493 B2
(45) Date of Patent: Dec. 10, 2013

(54) PHASE CHANGE MEMORY

(75) Inventors: Shyh-Shyuan Sheu, Taichung (TW);
Pei-Chia Chiang, Taipei (TW);
Wen-Pin Lin, Changhua County (TW)

(73) Assignee: Higgs Opl. Capital LLC, Dover, DE (US)

( * ) Notice: Subject to any disclaimer, the term of this patent is extended or adjusted under 35 U.S.C. 154(b) by 0 days.

(21) Appl. No.: 13/477,884

(22) Filed: May 22, 2012

(65) Prior Publication Data

US 2012/0230099 A1 Sep. 13, 2012

Related U.S. Application Data

(63) Continuation of application No. 12/563,971, filed on Sep. 21, 2009, now Pat. No. 8,199,561.

(30) Foreign Application Priority Data

Dec. 31, 2008 (TW) ................................. 97151765 A

(51) Int. Cl.
*G11C 11/00* (2006.01)
(52) U.S. Cl.
USPC ............................ 365/158; 365/171; 365/173
(58) Field of Classification Search
USPC .......................................... 365/158, 171, 173
See application file for complete search history.

(56) References Cited

U.S. PATENT DOCUMENTS

| | | | |
|---|---|---|---|
| 4,974,205 A | 11/1990 | Kotani | |
| 5,694,363 A | 12/1997 | Calligaro | |
| 5,787,042 A | 7/1998 | Morgan | |
| 5,883,837 A | 3/1999 | Calligaro | |
| 6,487,113 B1 | 11/2002 | Park et al. | |
| 7,054,213 B2 | 5/2006 | Laurent | |
| 7,110,286 B2 | 9/2006 | Choi et al. | |
| 7,154,774 B2 | 12/2006 | Bedeschi et al. | |
| 7,190,607 B2 | 3/2007 | Cho et al. | |
| 7,259,982 B2 | 8/2007 | Johnson | |
| 7,324,371 B2 | 1/2008 | Khouri et al. | |
| 7,359,231 B2 * | 4/2008 | Venkataraman et al. | ..... 365/148 |

(Continued)

FOREIGN PATENT DOCUMENTS

| CN | 1455412 | 11/2003 |
|---|---|---|
| CN | 1455412 A1 | 11/2003 |

(Continued)

OTHER PUBLICATIONS

J.H. Yi et al., "Novel Cell Structure of PRAM With Thin Metal Layer Inserted GeSbTe", IEEE, IEDM '03 Technical Digest, 2003, p. 901-904.

(Continued)

*Primary Examiner* — Son Dinh
*Assistant Examiner* — Nam Nguyen
(74) *Attorney, Agent, or Firm* — Stolowitz Ford Cowger LLP

(57) ABSTRACT

A phase change memory with an operating current that can be gradually increased or gradually decreased. The phase change memory has a phase change storage element, a transistor, and a control circuit. The transistor is operable to adjust the operating current flowing through the phase change storage element. The transistor has a first terminal coupled to a voltage source, a second terminal coupled to the phase change storage element, and a control terminal receiving a control signal from the control circuit. The control circuit is specially designed to limit the transistor in a linear region.

20 Claims, 8 Drawing Sheets

(56) References Cited

U.S. PATENT DOCUMENTS

| | | | |
|---|---|---|---|
| 7,388,775 B2 * | 6/2008 | Bedeschi et al. | 365/163 |
| 7,423,897 B2 * | 9/2008 | Wicker | 365/148 |
| 7,447,092 B2 | 11/2008 | Cho et al. | |
| 7,457,151 B2 | 11/2008 | Cho et al. | |
| 7,515,460 B2 | 4/2009 | Gordon et al. | |
| 7,521,372 B2 | 4/2009 | Chen | |
| 7,535,747 B2 | 5/2009 | Lee et al. | |
| 7,542,356 B2 | 6/2009 | Lee | |
| 7,566,895 B2 | 7/2009 | Chen | |
| 7,609,544 B2 | 10/2009 | Osada et al. | |
| 7,643,373 B2 | 1/2010 | Sheu et al. | |
| 7,646,627 B2 | 1/2010 | Hidaka | |
| 7,670,869 B2 | 3/2010 | Yu | |
| 7,672,176 B2 | 3/2010 | Chiang et al. | |
| 7,678,606 B2 | 3/2010 | Chen | |
| 7,679,163 B2 | 3/2010 | Chen et al. | |
| 7,745,811 B2 | 6/2010 | Lee et al. | |
| 7,773,408 B2 | 8/2010 | Takenaga et al. | |
| 7,773,409 B2 | 8/2010 | Chen et al. | |
| 7,773,410 B2 | 8/2010 | Sheu et al. | |
| 7,773,411 B2 | 8/2010 | Lin et al. | |
| 7,787,281 B2 | 8/2010 | Sheu et al. | |
| 7,796,454 B2 | 9/2010 | Lin et al. | |
| 7,796,455 B2 | 9/2010 | Chiang et al. | |
| 7,858,961 B2 | 12/2010 | Chuang et al. | |
| 7,885,109 B2 | 2/2011 | Lin et al. | |
| 7,889,547 B2 | 2/2011 | Sheu et al. | |
| 7,919,768 B2 | 4/2011 | Chen | |
| 7,923,714 B2 | 4/2011 | Hsu | |
| 7,933,147 B2 | 4/2011 | Lin et al. | |
| 7,964,862 B2 | 6/2011 | Chen et al. | |
| 7,974,122 B2 | 7/2011 | Lin et al. | |
| 8,199,561 B2 | 6/2012 | Sheu et al. | |
| 2005/0068804 A1 | 3/2005 | Choi et al. | |
| 2006/0221678 A1 | 10/2006 | Bedeschi | |
| 2007/0002654 A1 | 1/2007 | Borromeo | |
| 2008/0316847 A1 | 12/2008 | Lin et al. | |
| 2009/0122599 A1 | 5/2009 | Sheu et al. | |
| 2009/0189142 A1 | 7/2009 | Chen | |
| 2009/0296458 A1 | 12/2009 | Lee et al. | |
| 2010/0117050 A1 | 5/2010 | Chen et al. | |
| 2010/0165720 A1 | 7/2010 | Lin et al. | |
| 2010/0165723 A1 | 7/2010 | Sheu et al. | |

FOREIGN PATENT DOCUMENTS

| | | |
|---|---|---|
| CN | 101136452 | 3/2008 |
| CN | 101202326 | 6/2008 |
| CN | 101211959 | 7/2008 |
| CN | 101266834 A | 9/2008 |
| CN | 101271862 | 9/2008 |
| CN | 101276643 | 10/2008 |
| CN | 101308903 | 11/2008 |
| CN | 101312230 | 11/2008 |
| CN | 101330126 | 12/2008 |
| CN | 101335045 | 12/2008 |
| CN | 101369450 | 2/2009 |
| CN | 101383397 | 3/2009 |
| CN | 101414480 | 4/2009 |
| CN | 101452743 | 6/2009 |
| CN | 101471130 | 7/2009 |
| CN | 101504863 | 8/2009 |
| CN | 101504968 | 8/2009 |
| CN | 101599301 A | 12/2009 |
| CN | 101626060 B | 1/2010 |
| CN | 101740716 A | 6/2010 |
| CN | 101814323 A | 8/2010 |
| CN | 101819816 A | 9/2010 |
| JP | 2002246561 | 8/2002 |
| JP | 2004274055 | 9/2004 |
| JP | 2005525690 | 8/2005 |
| JP | 2006510220 | 3/2006 |
| JP | 2006108645 | 4/2006 |
| JP | 2006295168 | 10/2006 |
| JP | 2007103945 | 4/2007 |
| JP | 2007184591 | 7/2007 |
| JP | 2008171541 A | 7/2008 |
| JP | 2008193071 A | 8/2008 |
| JP | 2008226427 | 9/2008 |
| JP | 2008283163 A | 11/2008 |
| TW | 200828506 A | 7/2008 |
| TW | 200845443 A | 11/2008 |
| TW | 200849278 A | 12/2008 |
| TW | 200901196 A | 1/2009 |
| TW | I305042 B | 1/2009 |
| TW | 200908294 A | 2/2009 |
| TW | 200913252 A | 3/2009 |
| TW | 200915318 A | 4/2009 |
| TW | 200921682 A | 5/2009 |
| TW | 200926186 A | 6/2009 |
| TW | 200937693 A | 9/2009 |
| TW | 200951981 A | 12/2009 |
| TW | 200952169 A | 12/2009 |
| TW | I318470 B | 12/2009 |
| TW | 201003851 A | 1/2010 |
| TW | I320180 | 2/2010 |
| TW | 201019467 A | 5/2010 |
| TW | I324823 B | 5/2010 |
| TW | 201025326 A | 7/2010 |
| TW | 201025573 A | 7/2010 |
| TW | I326917 B | 7/2010 |
| TW | I328816 B | 8/2010 |
| TW | I330846 B | 9/2010 |
| TW | I334604 B | 12/2010 |
| TW | I336925 B | 2/2011 |
| TW | I342022 B | 5/2011 |
| TW | I343642 B | 6/2011 |

OTHER PUBLICATIONS

Stolowitz Ford Cowger LLP, "Listing of Related Cases", May 16, 2012, 1 page.

* cited by examiner

PHASE CHANGE MEMORY

CROSS REFERENCE TO RELATED APPLICATIONS

This application is a continuation of U.S. patent application Ser. No. 12/563,971, filed Sep. 21, 2009, which claims priority to Taiwan Patent Application No. 097151765, filed on Dec. 31, 2008, the specifications of which are herein incorporated by reference in their entirety.

BACKGROUND

1. Technical Field

The present disclosure relates to phase change memories (PCMs).

2. Description of the Related Art

Phase change materials have at least two phases: a crystalline phase, and an amorphous phase. A phase change memory uses phase change materials as storage elements therein (hereinafter named phase change storage elements). A crystalline phase is represented as logic '0' and an amorphous phase is represented as logic '1'.

The transformation between the crystalline phase and the amorphous phase is controlled by an operating current flowing through the phase change storage element. Table 1 is a comparison of operating current for a crystalline phase and an amorphous phase.

TABLE 1

Comparison of write current for a crystalline phase and an amorphous phase.

| | Operating current (in pulse form, oscillating between high and low voltage levels) | |
|---|---|---|
| | magnitude | duty period |
| crystalline phase | Low | Long |
| amorphous phase | High | Short |

Achieving complete crystallization is difficult. For example, an inappropriate operating current may result in incomplete crystallization, which affects reliability of the phase change storage element.

BRIEF SUMMARY

The disclosure unveils phase change memories. The phase change memory comprises a phase change storage element, a transistor for operating current adjustment and a control circuit. The transistor for operating current adjustment has a first terminal coupled to a voltage source, a second terminal coupled to the phase change storage element, and a control terminal receiving a control signal from the control circuit. The control circuit uses the control signal to limit the transistor in a linear region.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description shows several exemplary embodiments carrying out the disclosure. This description is made for the purpose of illustrating the general principles of the disclosure and should not be taken in a limiting sense. The scope of the disclosure is best determined by reference to the appended claims.

Figure 1A:
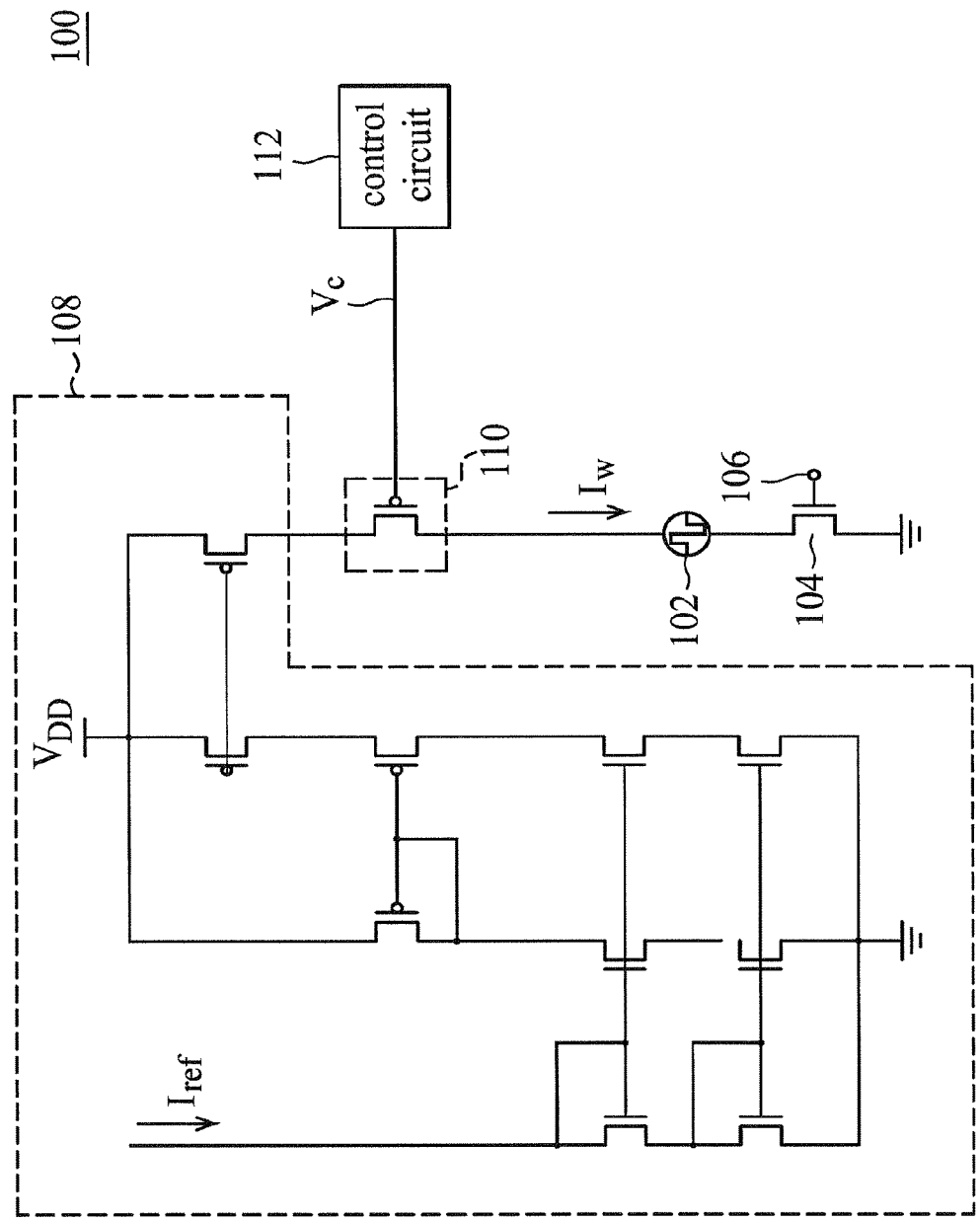
FIG. 1A depicts an exemplary embodiment of the phase change memory of the disclosure.

FIG. 1A depicts an exemplary embodiment of the phase change memory of the disclosure. A phase change memory 100 comprises a phase change storage element 102 which uses more than one phase, such as a crystalline state and an amorphous state, to store different logic values. As shown, a switch 104 is controlled by a word line 106 of the phase change memory 100. When the switch 104 is turned on, an operating current $I_W$ is allowed to flow into the phase change storage element 102 to read or write the phase change storage element 102. The operating current $I_W$ is dependent on the statuses of a current generator 108 and a operating current adjustment transistor 110. The structure of the current generator 108 does not limit the scope of the disclosure and may be replaced by other current generating circuits known by those skilled in the art. In FIG. 1A, the current generator 108 generates a current according to a reference current $I_{ref}$, and the current generator 108 is coupled between a voltage source $V_{DD}$ and the transistor 110. In this embodiment, the transistor 110 for operating current adjustment is realized by a P-type metal-oxide-semiconductor (PMOS) transistor, which has a source, a drain and a gate working as a first terminal, a second terminal and a control terminal of the transistor 110, respectively. In the following, a description of the connection of the transistor 110 (PMOS) is provided. As shown in FIG. 1A, the first terminal (source) is coupled to the voltage source $V_{DD}$ by the current generator 108, the second terminal (drain) is coupled to the phase change storage element 102, and the control terminal (gate) is controlled by a control signal $V_c$ provided by a control circuit 112. The control circuit 112 is designed to limit the transistor 110 in a linear region but not in a saturated region. Note that if the voltage level of the control signal $V_c$ is decreasing, then a result would be that the current value of the operating current $I_W$ would be concurrently increasing, and if the voltage level of the control signal $V_c$ is increasing, then a result would be that the current value of the operating current $I_W$ would be concurrently decreasing.

When transforming the phase change storage element 102 to a crystalline phase, a gradually increased operation current $I_W$ facilitates the crystallization process. Thus, the magnitude of the operation current $I_W$ is effectively reduced. Furthermore, a gradually decreased operation current $I_W$ facilitates the temper of the crystallization. Thus, the phase change storage element 102 can be completely crystallized.

Figure 1B:
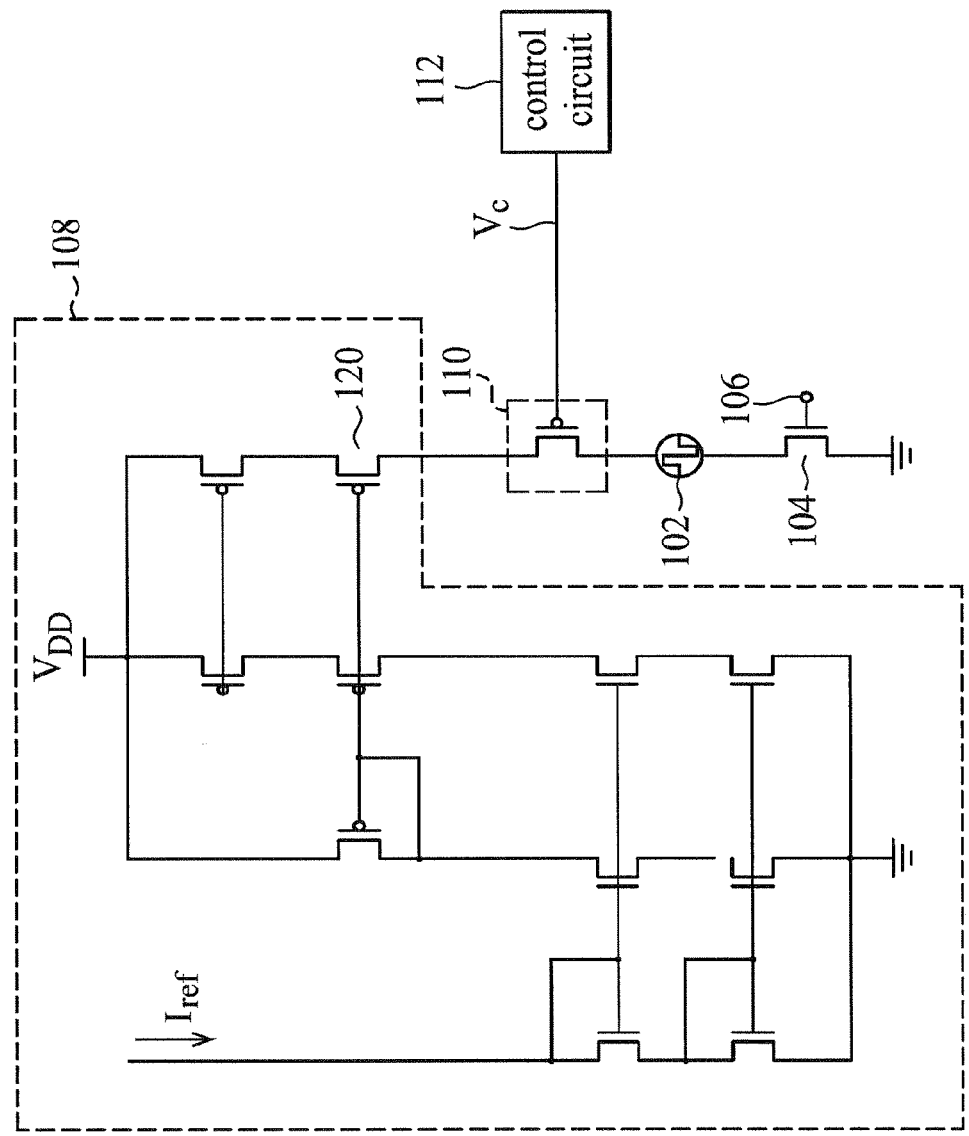
FIG. 1B depicts another exemplary embodiment of the phase change memory of the disclosure.

FIG. 1B depicts another exemplary embodiment of the phase change memory of the disclosure, wherein the current generator 108 is realized by another circuit. Compared to the circuit shown in FIG. 1A, the current generator 108 of FIG. 1B further comprises a transistor 120. The current generators 108 shown in FIGS. 1A and 1B do not limit the scope of the disclosure, and may be replaced by other circuits known by those skilled in the art.

Figure 2A:
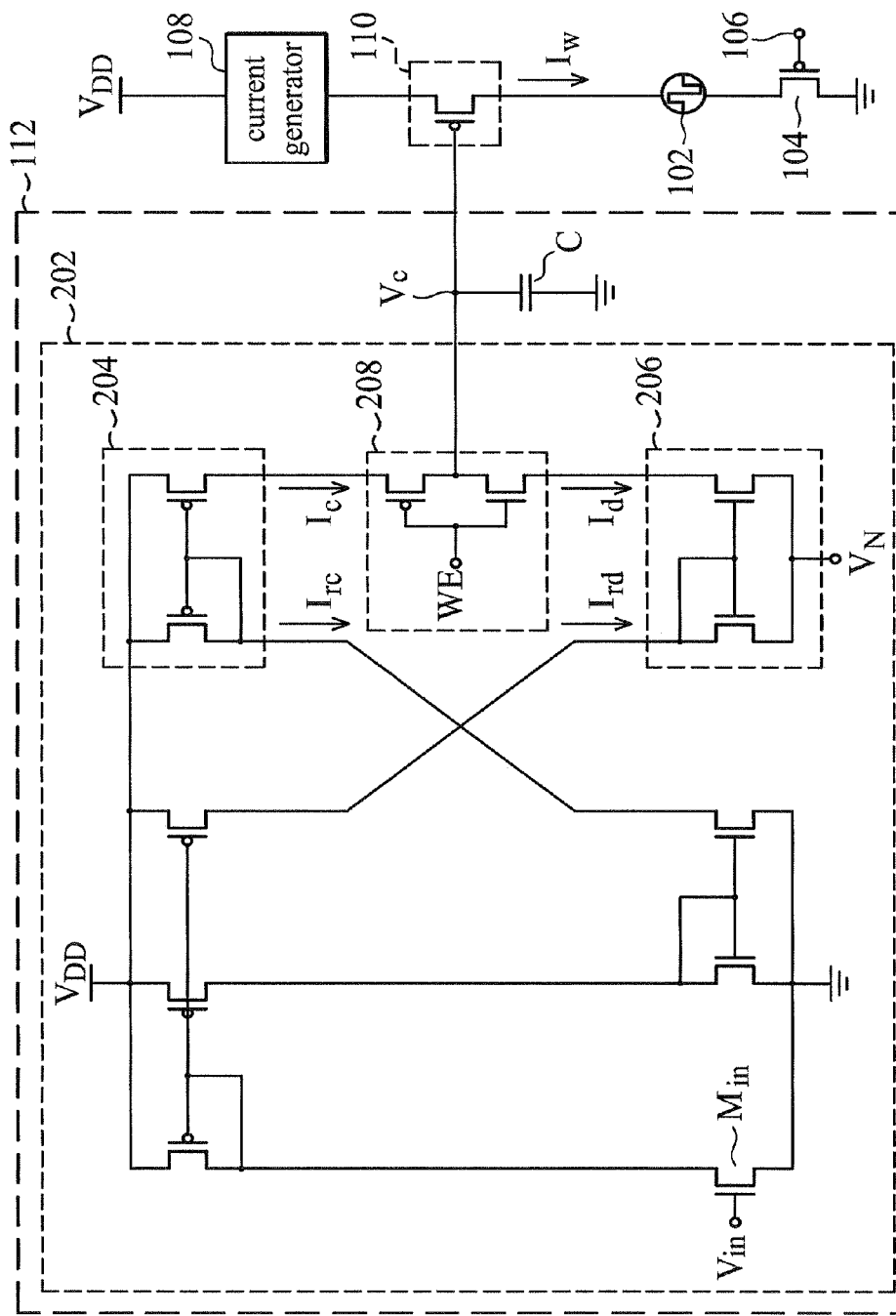
FIG. 2A depicts another exemplary embodiment of the phase change memory of the disclosure.

FIG. 2A depicts another exemplary embodiment of the phase change memory of the disclosure, which details an exemplary embodiment of the control circuit 112. As shown, the control circuit 112 comprises a capacitor C and a charge/discharge circuit 202. The capacitor C is coupled to the control terminal of the transistor 110. The voltage held by the capacitor C is the control signal $V_c$. The charge/discharge circuit 202 charges or discharges the capacitor C to vary the control signal $V_c$ between a first pre-determined voltage $V_N$ and the source voltage $V_{DD}$. The lower limit, $V_N$, of the control signal $V_c$ limits the transistor of the current adjuster 110 to work in a linear region. Thus, in the example shown in FIG. 2A, when the control signal $V_c$ is gradually decreased, the operating current $I_W$ is gradually increased; and when the control signal $V_c$ is gradually increased, the operating current $I_W$ is gradually decreased. The first pre-determined voltage $V_N$ is higher than the voltage level of the ground (GND).

This paragraph details the circuit of the charge/discharge circuit 202 of FIG. 2A. As shown in FIG. 2A, the charge/discharge circuit 202 comprises a first current mirror 204, a second current mirror 206 and a charge/discharge switch 208. The first current mirror 204 comprises a power terminal coupled to the voltage source $V_{DD}$, a reference current terminal for a charge reference current $I_{rc}$ to pass through, and a load terminal outputting a charge current $I_c$. The second current mirror 206 comprises a power terminal biased at the first per-determined voltage $V_N$, a reference current terminal receiving a discharge reference current $I_{rd}$, and a load terminal providing a discharge current $I_d$. The charge/discharge circuit 202 requires a bias voltage $V_{in}$, for setting the values of the charge reference current $I_{rc}$ and the discharge reference current $I_{rd}$. In another embodiment, the bias voltage $V_{in}$ may be dependent on the source voltage of the transistor $M_{in}$. For example, the gate and source of the transistor $M_{in}$ may be electrically connected. and thus, the values of the charge current $I_c$ and the discharge current $I_d$ are determined. The charge/discharge switch 208 is controlled by a switching signal WE to couple the capacitor C to the first current mirror 204 for a charge process or to the second current mirror 206 for a discharge process.

Figure 2B:
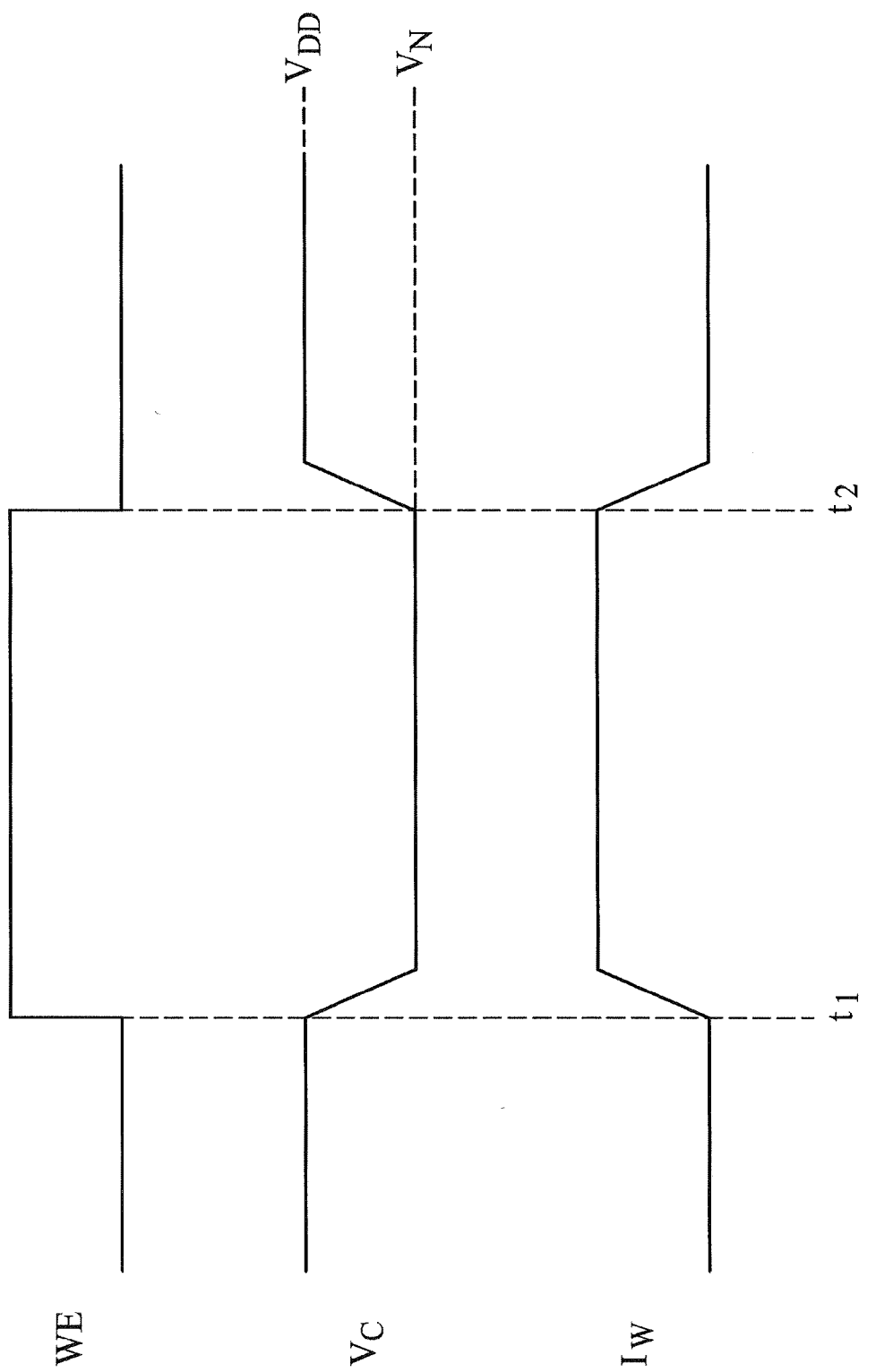
FIG. 2B shows waveforms depicting exemplary embodiments of the switching signal WE, the control signal $V_C$ and the operating current $I_W$ of FIG. 2A.

FIG. 2B shows waveforms depicting exemplary embodiments of the switching signal WE, the control signal $V_c$ and the operating current $I_W$ of FIG. 2A. At time index $t_1$, the switching signal WE is switched to high, and the charge/discharge switch 208 couples the capacitor C to the second current mirror 206 to discharge the capacitor C. When the capacitor C is discharged by the discharge current $I_d$, the control signal $V_c$ is decreased. At time index $t_2$, the switching signal WE is switched to low, and the charge/discharge switch 208 is switched to couple the capacitor C to the first current mirror 204 to charge the capacitor C. When the capacitor C is charged by the charge current the voltage level of the control signal $V_c$ is raised. Because the power terminals of the first and second current mirrors 204 and 206 are biased at the source voltage $V_{DD}$ and the first pre-determined voltage $V_N$, respectively, the control signal $V_c$ is limited between the voltage levels $V_N$ and $V_{DD}$, and thus, the transistor of the current adjuster 110 is operated in a linear region. According to the electronic characteristic of a PMOS transistor that is in a linear region, if the voltage level of the control signal $V_c$ is decreasing, then a result would be that the current value of the operating current $I_W$ would be concurrently increasing, and if the voltage level of the control signal $V_c$ is increasing, then a result would be that the current value of the operating current $I_W$ would be concurrently decreasing. Thus, the operating current $I_W$ is increased gradually and then decreased gradually as shown in FIG. 2B.

Figure 3A:
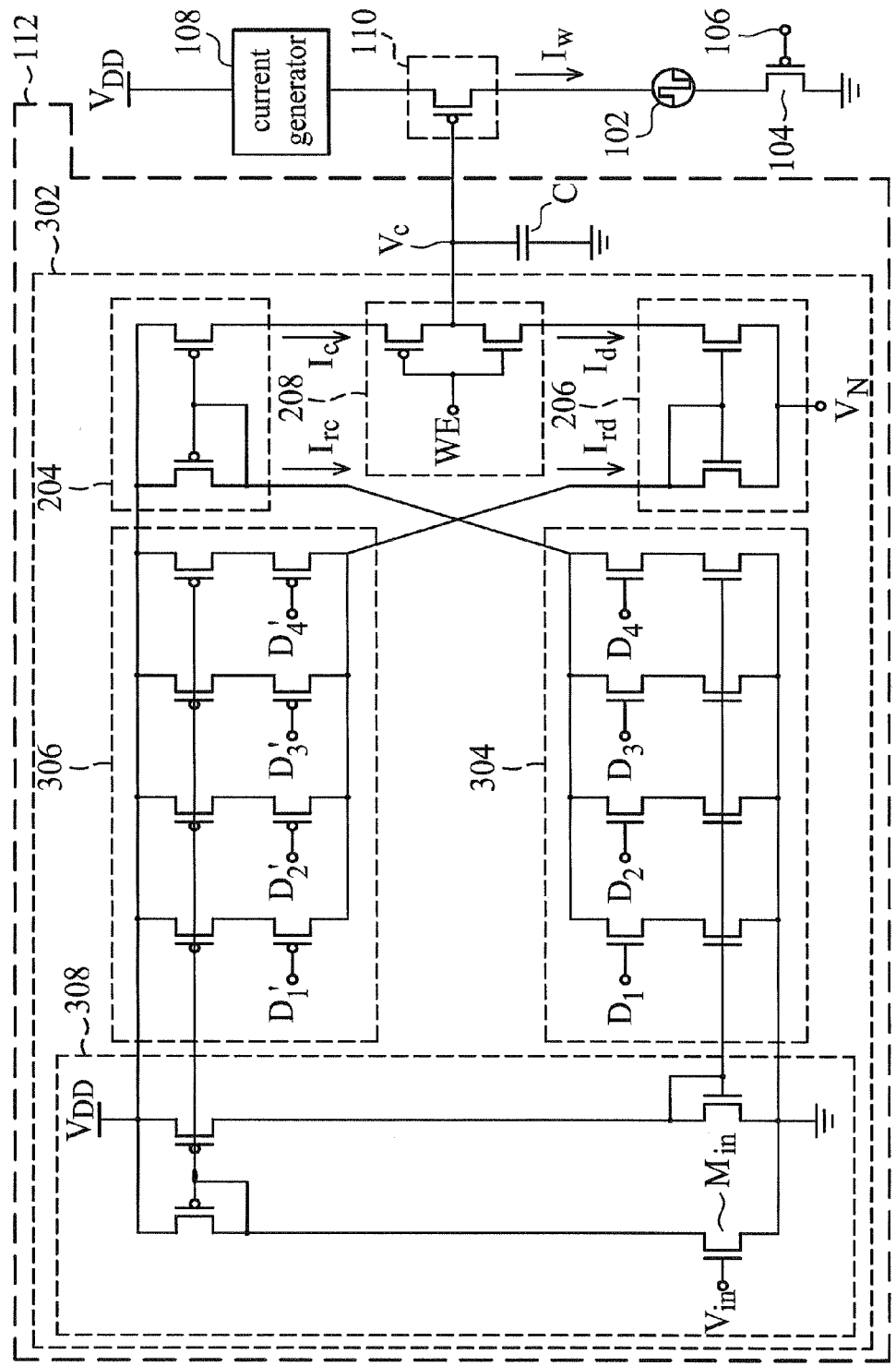
FIG. 3A depicts another exemplary embodiment of the phase change memory of the disclosure.

FIG. 3A depicts another exemplary embodiment of the phase change memory of the disclosure. Compared with the charge/discharge circuit 202 of FIG. 2A, the charge/discharge circuit 302 of FIG. 3A further comprises a first digital-to-analog converter 304 and a second digital-to-analog converter 306. The first and second digital-to-analog converters 304 and 306 are biased by a bias circuit 308 that is controlled by a bias voltage $V_{in}$. The first digital-to-analog converter 304 converts a first digital data ($D_1$, $D_2$, $D_3$, $D_4$) to the charge reference current $I_{re}$ which determines the value of the charge current $I_c$. Thus, the rising speed of the control signal $V_c$ may be determined. The second digital-to-analog converter 306 converts a second digital data ($D_1'$, $D_2'$, $D_3'$, $D_4'$) to the discharge reference current $I_{rd}$ which determines the value of the discharge current $I_d$. Thus, the decreasing speed of the control signal $V_c$ may be determined.

Figure 3B:
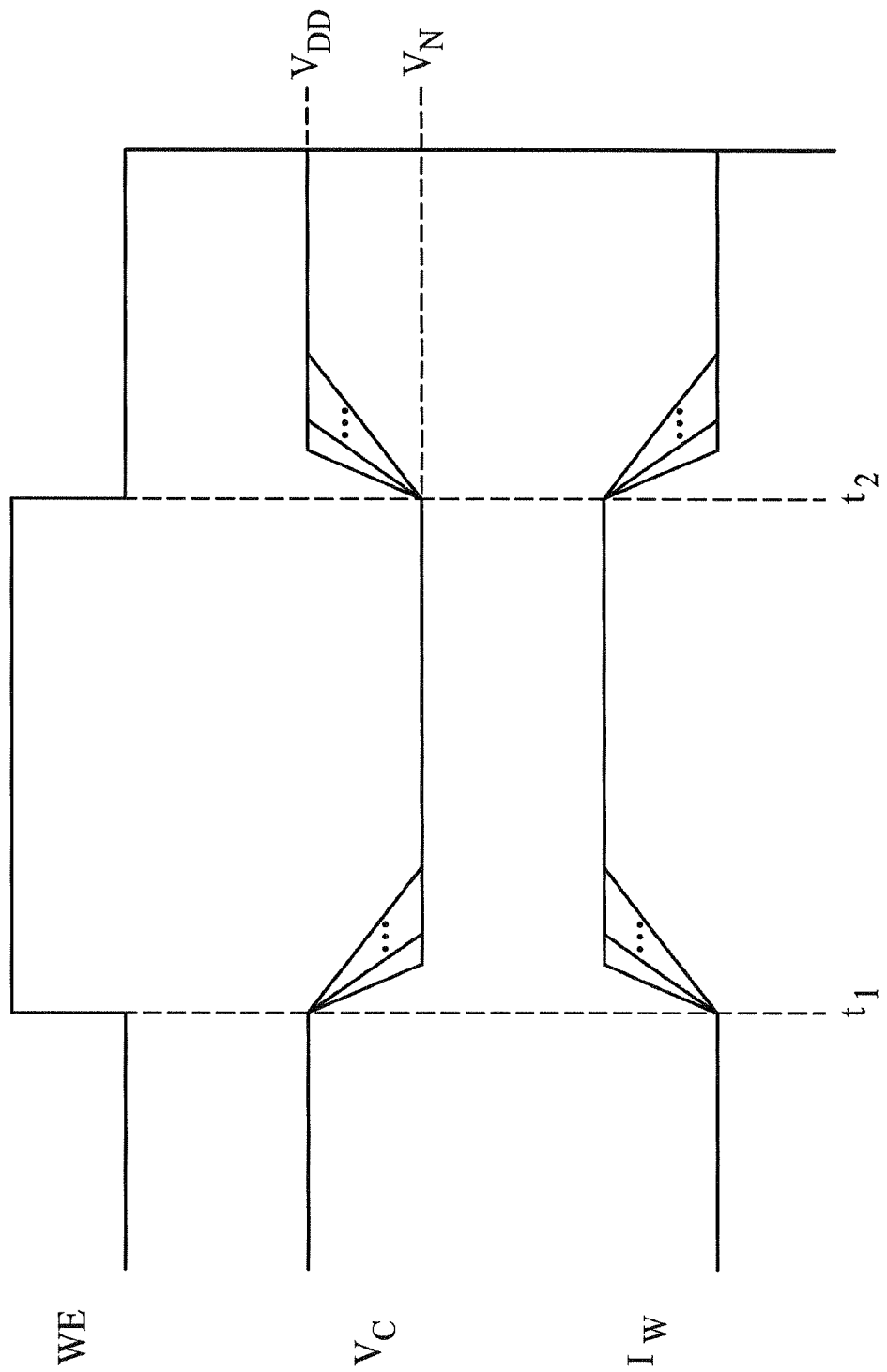
FIG. 3B shows waveforms of exemplary embodiments of the switching signal WE, the control signal $V_C$ and the operating current $I_W$ of FIG. 3A.

FIG. 3B shows waveforms of exemplary embodiments of the switching signal WE, the control signal $V_c$ and the operating current $I_W$ of FIG. 3A. At time index $t_1$, the control signal $V_c$ may be decreased at various speeds by different settings of the second digital data ($D_1'$, $D_2'$, $D_3'$, $D_4'$). Thus, the operating current $I_W$ may be raised by various speeds. At time index $t_2$, the control signal $V_c$ may be increased at various speeds by different settings of the first digital data ($D_1$, $D_2$, $D_3$, $D_4$). Thus, the operating current $I_W$ may be decreased by various speeds.

In other exemplary embodiments, the control circuit 112 may comprise the first digital-to-analog converter 304 but not the second digital-to-analog converter 306. In such a case, the operating current $I_W$ has a fixed rising speed but a controllable falling speed. In some exemplary embodiments, the control circuit 112 may comprise the second digital-to-analog converter 306 but not the first digital-to-analog converter 304. In such an embodiment, the operating current $I_W$ has a controllable rising speed but a fixed falling speed.

The controllable rising/falling speeds of the operating current $I_W$ may be used in accomplish multi-leveled storage capability, wherein multi-bits are stored by a single phase change storage element.

Figure 4:
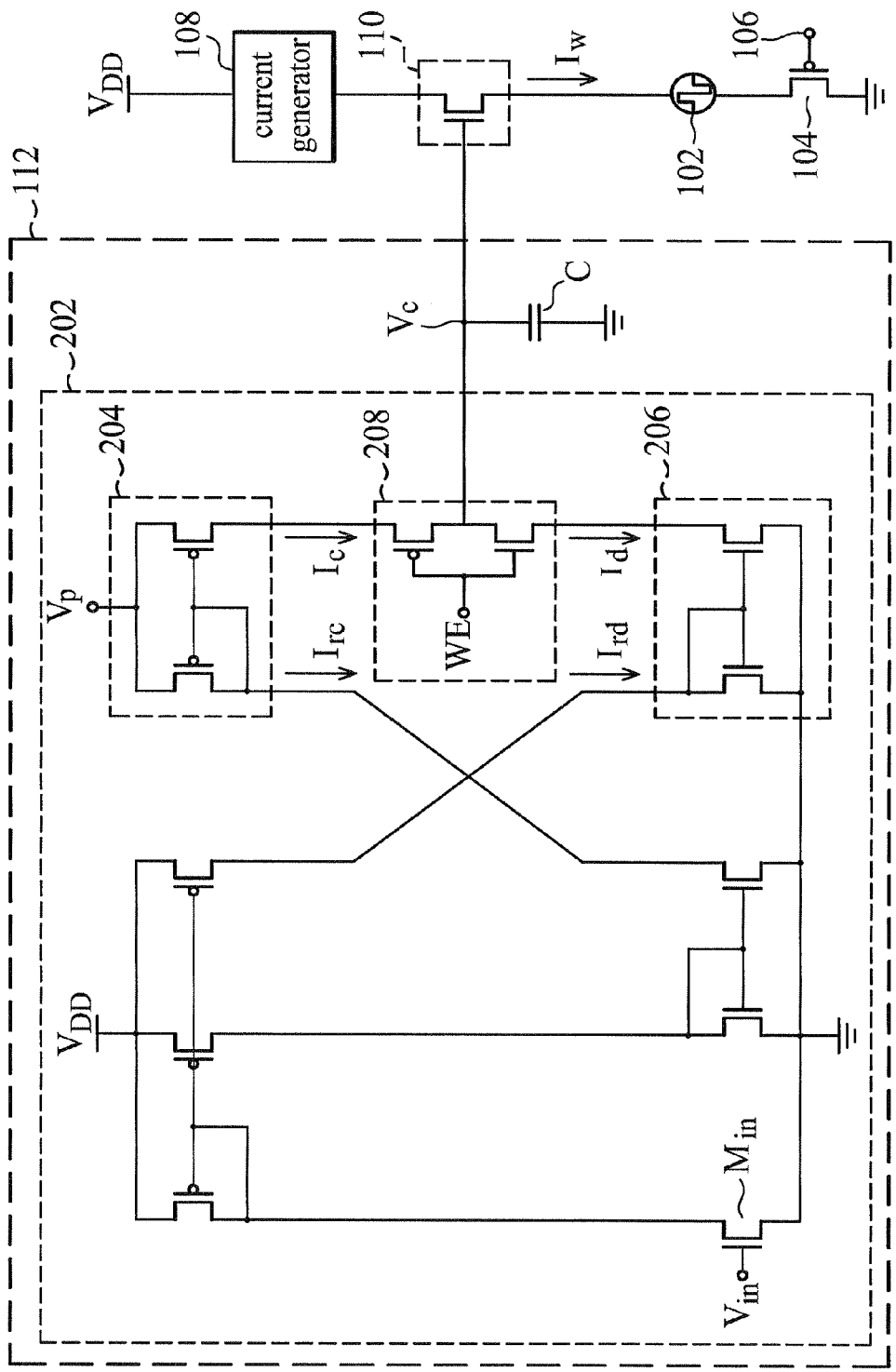
FIG. 4 depicts another exemplary embodiment of the phase change memory of the disclosure.

The transistor 110 is not limited to be a PMOS transistor, and may be replaced by an N-type metal-oxide-semiconductor (NMOS) transistor. FIG. 4 depicts another exemplary embodiment of the phase change memory of the disclosure, wherein the transistor 110 is realized by an NMOS transistor. As shown in FIG. 4, a first current mirror 204 has a power terminal biased at a second pre-determined voltage $V_P$ (lower than source voltage $V_{DD}$) and the second current mirror 206 has a grounded power terminal. Thus, the NMOS transistor (the transistor 110) is in a linear region.

Figure 5:
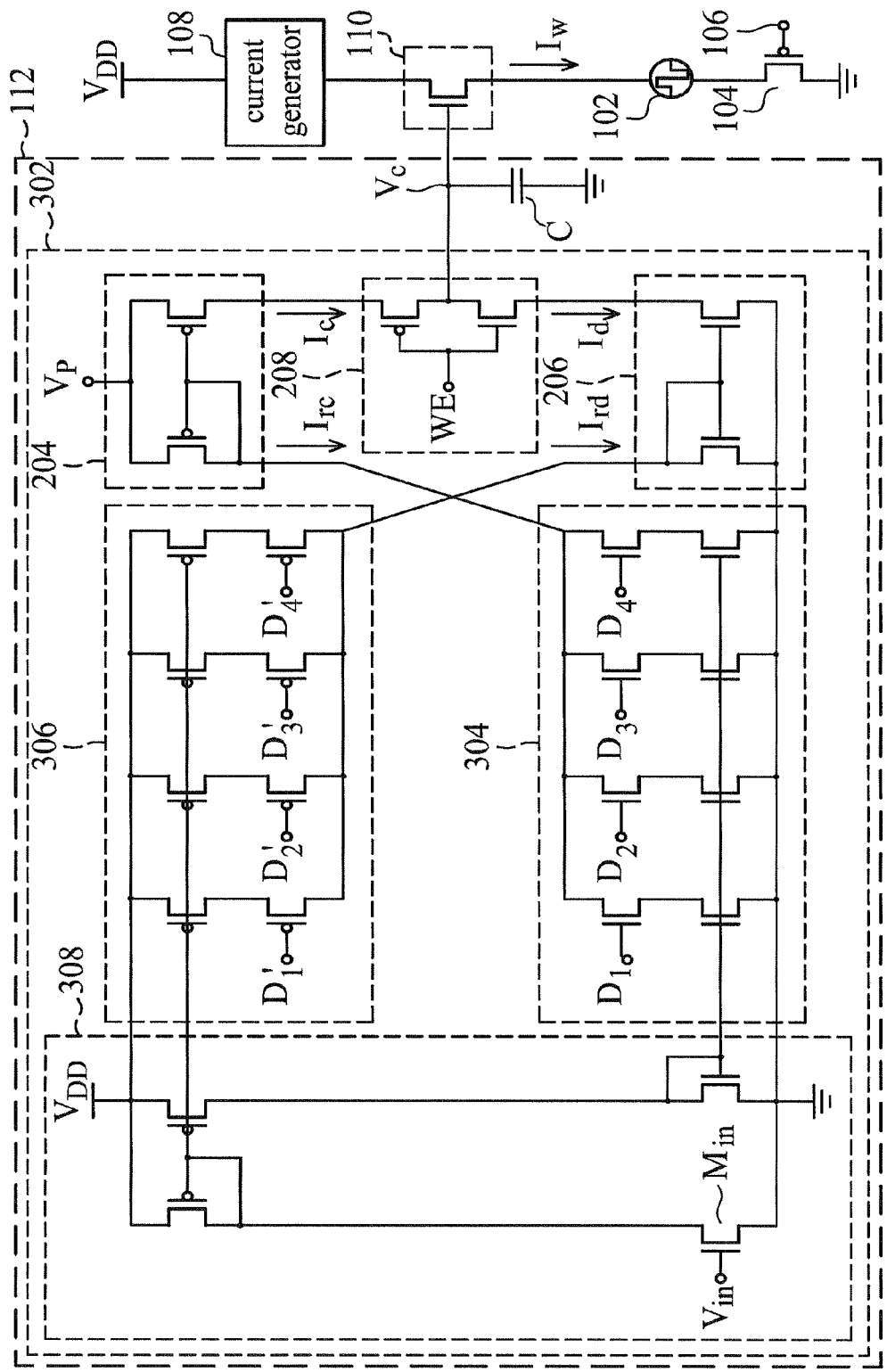
FIG. 5 depicts another exemplary embodiment of the phase change memory of the disclosure.

FIG. 5 depicts another exemplary embodiment of the phase change memory of the disclosure, wherein the transistor 110 is realized by an NMOS transistor. As shown in FIG. 5, a first current mirror 204 has a power terminal biased at a second pre-determined voltage value $V_P$ that is lower than the voltage $V_{DD}$, and a second current mirror 206 has a grounded power terminal. Thus, the NMOS transistor (the transistor 110) is in a linear region.

In some exemplary embodiments of the phase change memory of the disclosure, the capacitor C is optional. In embodiments in which the control circuit 112 does not include the capacitor C, the charge/discharge circuit (such as circuit 202 or 302) is designed to charge/discharge the parasitic capacitors at the control terminal of the transistor 110. The voltage level of the control terminal of the transistor 110 is carefully controlled, and the transistor 110 is limited in a linear region.

When the transistor 110 is realized by a PMOS transistor, the charge/discharge circuit (such as 202 or 302 of FIGS. 2A and 3A) is designed to charge/discharge the parasitic capacitors at the gate of the PMOS transistor.

When the transistor 110 is realized by an NMOS transistor, the charge/discharge circuit (such as 202 or 302 of FIGS. 4, 5) is designed to charge/discharge the parasitic capacitors at the gate of the NMOS transistor.

While the disclosure has been described by way of example and in terms of the exemplary embodiments, it is to be understood that the disclosure is not limited to the unveiled embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A circuit, comprising:
a current generator configured to generate an operating current to read from or write to a phase change storage element;
a control circuit configured to generate a control signal by charging or discharging a capacitor, wherein the control circuit includes:
a first load terminal configured to output a charge current; and
a second load terminal configured to output a discharge current, and wherein the control circuit is further configured to:
operatively couple the capacitor to the first load terminal to charge the capacitor; and
operatively couple the capacitor to the second load terminal to discharge the capacitor; and
a switching element configured to provide the operating current to the phase change storage element in response to the control signal.

2. The circuit of claim 1, wherein the control circuit is further configured to generate the control signal by charging or discharging the capacitor between a predetermined first voltage level and a second voltage level.

3. The circuit of claim 2, wherein the second voltage level comprises a source voltage level, and wherein the predetermined first voltage level is greater than ground.

4. The circuit of claim 2, wherein the second voltage level comprises ground, and wherein the predetermined first voltage level is less than a source voltage level.

5. The circuit of claim 1, wherein the switching element comprises a P-type metal-oxide semiconductor (PMOS) transistor, and wherein the capacitor is operatively coupled to a gate of the PMOS transistor.

6. The circuit of claim 1, wherein the switching element comprises an N-type metal-oxide semiconductor (NMOS) transistor, and wherein the capacitor is operatively coupled to a gate of the NMOS transistor.

7. The circuit of claim 1, wherein the control signal is configured to maintain operation of the switching element in a linear region in response to the control signal.

8. The circuit of claim 1, further comprising:
a first digital-to-analog converter configured to generate a charge reference current, wherein the first load terminal is configured to output the charge current in response to the charge reference current; and
a second digital-to-analog converter configured to generate a discharge reference current, wherein the second load terminal is configured to output the discharge current in response to the discharge reference current.

9. A method, comprising:
generating an operating current to read from or write to a phase change storage element;
generating a control signal by operatively coupling a capacitor to a first load terminal to discharge the capacitor, wherein a second load terminal is operatively coupled to the capacitor to charge the capacitor; and
adjusting a flow of the operating current to the phase change storage element in response to the control signal.

10. The method of claim 9, wherein the flow of the operating current is adjusted by a transistor operatively coupled to the capacitor.

11. The method of claim 10, further comprising maintaining operation of the transistor in a linear region in response to the control signal.

12. The method of claim 9, wherein said generating a control signal further comprises generating a charge reference current with a digital-to-analog converter, and wherein the operating current has a fixed rising speed and a controllable falling speed.

13. The method of claim 9, wherein said generating a control signal further comprises generating a discharge reference current with a digital-to-analog converter, and wherein the operating current has a controllable rising speed and a fixed falling speed.

14. The method of claim 9, wherein said generating a control signal comprises generating the control signal between a predetermined first voltage level and a second voltage level, wherein the second voltage level comprises a source voltage level, and wherein the predetermined first voltage level is greater than ground.

15. The method of claim 9, wherein said generating a control signal comprises generating the control signal between a predetermined first voltage level and a second voltage level, wherein the second voltage level comprises ground, and wherein the predetermined first voltage level is less than a source voltage level.

16. The method of claim 9, wherein said generating a control signal further comprises:
operatively de-coupling the capacitor from the first load terminal; and
operatively coupling the capacitor to the second load terminal to charge the capacitor.

17. An apparatus, comprising:
means for generating an operating current to read from or write to a phase change storage element;
means for generating a control signal by charging or discharging a capacitor between a predetermined first voltage level and a second voltage level;
means for generating a charge current;
means for generating a discharge current;
means to switch the capacitor between being operatively coupled to the means for generating a charge current and being operatively coupled to the means for generating a discharge current; and
means for transmitting the operating current to the phase change storage element in response to the control signal.

18. The apparatus of claim 17, wherein the control signal is configured to maintain operation of the means for transmitting in a linear region in response to the control signal.

19. The apparatus of claim 17, wherein the second voltage level comprises a source voltage level, and wherein the predetermined first voltage level is greater than ground.

20. The apparatus of claim 17, wherein the second voltage level comprises ground, and wherein the predetermined first voltage level is less than a source voltage level.

\* \* \* \* \*

UNITED STATES PATENT AND TRADEMARK OFFICE
CERTIFICATE OF CORRECTION

| | | |
|---|---|---|
| PATENT NO. | : 8,605,493 B2 | Page 1 of 1 |
| APPLICATION NO. | : 13/477884 | |
| DATED | : December 10, 2013 | |
| INVENTOR(S) | : Sheu et al. | |

It is certified that error appears in the above-identified patent and that said Letters Patent is hereby corrected as shown below:

On the Title Page, in Item (56), under "FOREIGN PATENT DOCUMENTS", in Column 2, Line 1, delete "CN 1455412 11/2003".

In the Specification

In Column 2, Line 37, delete "a operating" and insert -- an operating --, therefor.

In Column 3, Line 42, delete "current $I_{nt}$ In" and insert -- current $I_{nt}$. In --, therefor.

In Column 3, Line 45, delete "connected." and insert -- connected --, therefor.

In Column 3, Line 62, delete "current" and insert -- current $I_c$, --, therefor.

Signed and Sealed this
Thirteenth Day of May, 2014

Michelle K. Lee
*Deputy Director of the United States Patent and Trademark Office*